(12) United States Patent
Sun et al.

(10) Patent No.: US 7,044,836 B2
(45) Date of Patent: May 16, 2006

(54) COATED METAL OXIDE PARTICLES FOR CMP

(75) Inventors: Fred F. Sun, Naperville, IL (US); Bin Lu, Naperville, IL (US); Ethan K. Lightle, Lostant, IL (US); Shumin Wang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 79 days.

(21) Appl. No.: 10/419,580

(22) Filed: Apr. 21, 2003

(65) Prior Publication Data

US 2004/0209555 A1 Oct. 21, 2004

(51) Int. Cl.
*B24B 1/00* (2006.01)

(52) U.S. Cl. .......................... 451/41; 451/60; 451/287; 451/288; 451/446; 51/307; 51/308; 51/309

(58) Field of Classification Search ............ 451/41, 451/60, 287, 288, 446; 51/307, 308, 309
See application file for complete search history.

(56) References Cited

U.S. PATENT DOCUMENTS

| | | | |
|---|---|---|---|
| 4,563,483 A | 1/1986 | Smith et al. | |
| 4,665,116 A | 5/1987 | Kornhaber et al. | |
| 5,226,930 A | 7/1993 | Sasaki | |
| 5,645,736 A | 7/1997 | Allman | |
| 5,767,016 A | 6/1998 | Muroyama | |
| 5,861,055 A | 1/1999 | Heidel et al. | |
| 6,372,648 B1 | 4/2002 | Hall et al. | |
| 6,656,241 B1 * | 12/2003 | Hellring et al. | ............... 51/308 |
| 2002/0003225 A1 | 1/2002 | Hampden-Smith et al. | |

FOREIGN PATENT DOCUMENTS

| | | | |
|---|---|---|---|
| EP | 1 020 488 A2 | | 7/2000 |
| EP | 1020488 A2 * | | 7/2000 |
| EP | 1 104 778 A2 | | 6/2001 |
| WO | WO 01/04226 A2 | | 1/2001 |

\* cited by examiner

*Primary Examiner*—Joseph J. Hail, III
*Assistant Examiner*—Shantese L. McDonald
(74) *Attorney, Agent, or Firm*—Robert Lanning; Frank Koszyk

(57) ABSTRACT

The invention provides a method of polishing a substrate, which method comprises the steps of (i) providing a polishing composition, (ii) providing a substrate comprising at least one metal layer, and (iii) abrading at least a portion of the metal layer with the polishing composition to polish the substrate. The polishing composition comprises an abrasive and a liquid carrier, wherein the abrasive comprises metal oxide particles having a surface with a silane compound adhered to a portion thereof and a polymer adhered to the silane compound and wherein the polymer is selected from the group consisting of water-soluble polymers and water-emulsifiable polymers. The invention also provides a polishing composition as described above, wherein the total amount of abrasive particles present in the polishing composition is no greater than about 20% by weight of the polishing composition, and the metal oxide particles do not comprise zirconia.

44 Claims, No Drawings

COATED METAL OXIDE PARTICLES FOR CMP

FIELD OF THE INVENTION

This invention pertains to a polishing composition and a method of polishing a substrate using the same.

BACKGROUND OF THE INVENTION

Compositions and methods for polishing (e.g., planarizing) the surface of a substrate are well known in the art. Polishing compositions (also known as polishing slurries) typically contain an abrasive material in an aqueous solution and are applied to a surface by contacting the surface with a polishing pad saturated with the polishing composition. Typical abrasive materials include metal oxide particles, such as silicon dioxide, cerium oxide, aluminum oxide, zirconium oxide, and tin oxide. U.S. Pat. No. 5,527,423, for example, describes a method for chemically-mechanically polishing (CMP) a metal layer by contacting the surface with a polishing composition comprising high purity fine metal oxide particles in an aqueous medium. The polishing composition is typically used in conjunction with a polishing pad (e.g., polishing cloth or disk). Suitable polishing pads are described in U.S. Pat. Nos. 6,062,968, 6,117,000, and 6,126,532, which disclose the use of sintered polyurethane polishing pads having an open-celled porous network, and U.S. Pat. No. 5,489,233, which discloses the use of solid polishing pads having a surface texture or pattern. Alternatively, the abrasive material may be incorporated into the polishing pad. U.S. Pat. No. 5,958,794 discloses a fixed abrasive polishing pad.

Despite the advantages of polishing compositions comprising metal oxide particles, these polishing compositions often become colloidally unstable (i.e., the metal oxide particles coagulate and fall out of suspension) within certain pH ranges. For instance, polishing compositions comprising silica particles are known to be colloidally unstable at mildly acidic pH (e.g., pH of about 4–6). Such colloidal instability and the resulting precipitation of the metal oxide particles severely limit the effectiveness of these polishing compositions. However, certain applications require a polishing composition having a pH within the range at which conventional polishing compositions comprising metal oxide are colloidally unstable. Accordingly, several attempts have been made to provide polishing compositions which contain metal oxide abrasives and exhibit colloidal stability over a broad range of pH values. These attempts have variably involved the addition of additives to the polishing composition or the application of a coating to the surface of the metal oxide particles. However, these additives and coatings can significantly affect the electrical charge present at the surface of the metal oxide particles, which can negatively impact the effectiveness of the polishing composition.

A need therefore exists for a polishing composition comprising metal oxide particles that is colloidally stable over a wide pH range. A need also exists for a method of polishing a substrate with such a polishing composition. The invention provides such a composition and method. These and other advantages of the invention, as well as additional inventive features, will be apparent from the description of the invention provided herein.

BRIEF SUMMARY OF THE INVENTION

The invention provides a method of polishing a substrate, which method comprises the steps of (i) providing a polishing composition, (ii) providing a substrate comprising at least one metal layer, and (iii) abrading at least a portion of the metal layer with the polishing composition to polish the substrate. The polishing composition comprises an abrasive and a liquid carrier, wherein the abrasive comprises metal oxide particles having a surface with a silane compound adhered to a portion thereof and a polymer adhered to the silane compound and wherein the polymer is selected from the group consisting of water-soluble polymers and water-emulsifiable polymers.

The invention also provides a polishing composition comprising an abrasive and a liquid medium, wherein the abrasive comprises metal oxide particles having a surface with a silane compound adhered to a portion thereof and a polymer adhered to the silane compound. The polymer is selected from the group consisting of water-soluble polymers and water-emulsifiable polymers, the total amount of abrasive particles present in the polishing composition is no greater than about 20% by weight of the polishing composition, and the metal oxide particles do not comprise zirconia.

DETAILED DESCRIPTION OF THE INVENTION

The invention provides a polishing composition comprising an abrasive and a liquid medium, wherein the abrasive comprises (a) metal oxide particles having a surface with a silane compound adhered to a portion thereof and (b) a polymer adhered to the silane compound. The polymer is selected from the group consisting of water-soluble polymers and water-emulsifiable polymers.

The metal oxide particles used in conjunction with the invention can be any suitable metal oxide particles. Preferably, the metal oxide particles comprise a metal oxide selected from the group consisting of alumina, silica, titania, ceria, zirconia, germania, magnesia, tantalum oxide ($TaO_x$), and combinations thereof. In certain embodiments, the metal oxide particles do not comprise zirconia. Most preferably, the metal oxide particles comprise silica.

The metal oxide particles can be present in the polishing composition in any suitable amount. Typically, the total amount of metal oxide particles present in the polishing composition is no greater than about 20% by weight of the polishing composition (e.g., about 0.01–20 wt. %, about 0.1–10 wt. %, or about 0.5–5 wt. %).

The silane compound adhered to a portion of the surface of the metal oxide particles can be any suitable silane compound. Preferably, the silane compound is selected from the group consisting of functionalized silanes, disilanes, trisilanes, oligomeric silanes, polymeric silanes, and combinations thereof. More preferably, the silane compound comprises at least one functional group selected from the group consisting of amine groups, carboxylic acid groups, anhydride groups, phosphonic acid groups, pyridinyl groups, hydroxyl groups, epoxy groups, and salts thereof. Most preferably, the silane compound comprises at least one amine group. As those of ordinary skill in the art will readily understand, each of the aforementioned functional groups can be protonated or deprotonated/unprotonated depending upon the pH of the polishing composition and the $pK_a$ of the particular silane compound.

The silane compound can be adhered to a portion of the surface of the metal oxide particles in any suitable manner. Generally, the silane compound is adhered to a portion of the surface of the metal oxide through one or more covalent bonds, one or more electrostatic bonds (e.g., one or more ionic bonds), one or more hydrogen bonds, one or more Van der Waals bonds, or combinations thereof. Preferably, the silane compound is adhered to a portion of the surface of the metal oxide particle through one or more covalent bonds.

The silane compound can be adhered to any suitable amount of the surface of the metal oxide particles. Preferably, the silane compound is adhered to at least about 5%, more preferably at least about 10%, and most preferably at least about 15% of the surface of the metal oxide particles.

The polymer used in conjunction with the invention is selected from the group consisting of water-soluble and water-emulsifiable polymers. The polymer can be an anionic, cationic, or nonionic polymer (e.g., polyvinyl alcohol). As utilized herein, the term "water-soluble" refers to a polymer that has a solubility of at least about 0.1 mg/ml (e.g., at least about 1 mg/ml) in water at 25° C. Preferably, the water-soluble polymer is freely soluble in water at 25° C. As utilized herein, the term "water-emulsifiable" refers to a polymer that forms a stable, oil-in-water emulsion at 25° C.

The polymer can be an anionic polymer or copolymer. Preferably, the anionic polymer or copolymer comprises repeating units containing carboxylic acid, sulfonic acid, or phosphonic acid functional groups, or combinations thereof. More preferably, the anionic polymer or copolymer comprises repeating units selected from the group consisting of acrylic acid, methacrylic acid, itaconic acid, maleic acid, maleic anhydride, vinyl sulfonic acid, 2-methacryloyloxyethanesulfonate, styrenesulfonic acid, 2-acrylamido-2-methylpropane sulfonic acid (AMPS), vinylphosphonic acid, 2-(methacryloyloxy)ethylphosphate, salts thereof, and combinations thereof.

The polymer can be a cationic polymer or copolymer. Preferably, the cationic polymer or copolymer comprises repeating units containing amine functional groups. Suitable amine functional groups can be primary, secondary, tertiary, or quaternary (i.e., ammonium). More preferably, the cationic polymer or copolymer comprises repeating units selected from the group consisting of allylamine, vinylamine, ethyleneimine, vinyl pyridine, diethylaminoethyl methacrylate, diallyldimethylammonium chloride, methacryloyloxyethyltrimethylammonium sulfate, and combinations thereof. As those of ordinary skill in the art will readily understand, the aforementioned units can be protonated or unprotonated/deprotonated depending upon the pH of the polishing composition and the $pK_a$ of the particular polymer. More specifically, if the pH of the polishing composition is less than the $pK_a$ of the polymer, the aforementioned unit of the polymer will be protonated. By way of contrast, if the pH of the polishing composition is greater than the $pK_a$ of the polymer, the aforementioned unit of the polymer will be unprotonated/deprotonated.

Any suitable combinations of the aforementioned silane compounds and polymers can be used to produce the abrasive present in the polishing composition of the invention. In a preferred embodiment, the polymer is an anionic polymer or copolymer comprising repeating units containing carboxylic acid, sulfonic acid, or phosphonic acid functional groups, or combinations thereof, and the silane compound comprises at least one amine group. In another preferred embodiment, the silane compound comprises at least one functional group selected from the group consisting of hydroxyl groups, epoxy groups, and salts thereof, and the polymer comprises at least one functional group selected from the group consisting of amine groups, carboxylic acid groups, and salts thereof.

The polymer can be adhered to the silane compound in any suitable manner. Generally, the polymer is adhered to the silane compound through one or more covalent bonds, one or more electrostatic bonds (e.g., one or more ionic bonds), one or more hydrogen bonds, one or more Van der Waals bonds, or combinations thereof. Preferably, the polymer is adhered to the silane compound through one or more electrostatic bonds.

In addition to being adhered to the silane compound, the polymer also can be adhered to a portion of the surface of the metal oxide particles. While not wishing to be bound to any particular theory, it is believed that the attachment of the polymer directly to the surface of the metal oxide particles provides for further colloidal stability by shielding the particles from the attractive forces that lead to agglomeration at conditions which typically cause the polishing composition to be colloidally unstable.

The abrasive used in the invention (i.e., metal oxide particles having a surface with a silane compound adhered to a portion thereof and a polymer attached to the silane compound) can have any suitable zeta potential. The zeta potential of a particle refers to the difference between the electrical charge of the ions surrounding the particle and the electrical charge of the bulk solution (e.g., the liquid carrier and any other components dissolved therein). Generally, the abrasive particles have a zeta potential such that the abrasive particles are colloidally stable in the polishing composition. Preferably, the abrasive particles have a zeta potential of less than 0 mV, more preferably less than about −5 mV, and most preferably less than about −10 mV, in the polishing composition.

The abrasive particles preferably are colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The liquid carrier can be any suitable carrier (e.g., solvent). Suitable liquid carriers include, for example, aqueous carriers (e.g., water) and non-aqueous carriers. Preferably, the liquid carrier is water, more preferably de-ionized water.

The polishing composition of the invention can further comprise an acid. In certain embodiments, the acid is an inorganic acid. Preferably, the inorganic acid is selected from the group consisting of nitric acid, phosphoric acid, sulfuric acid, salts thereof, and combinations thereof. The acid also can be an organic acid. Preferably, the organic acid is selected from the group consisting of oxalic acid, malonic acid, tartaric acid, acetic acid, lactic acid, propionic acid, phthalic acid, benzoic acid, citric acid, succinic acid, salts thereof, and combinations thereof.

The polishing composition can have any suitable pH. Typically, the polishing composition has a pH of about 3 to about 7. Preferably, the polishing composition has a pH of about 4 to about 6.

The polishing composition can further comprise a surfactant. Suitable surfactants include, but are not limited to, cationic surfactants, anionic surfactants, nonionic surfactants, amphoteric surfactants, fluorinated surfactants, and mixtures thereof.

The polishing composition can further comprise a chemical oxidizing agent. The chemical oxidizing agent can be any suitable oxidizing agent. Suitable oxidizing agents include inorganic and organic per-compounds, bromates, nitrates, chlorates, chromates, iodates, iron and copper salts (e.g., nitrates, sulfates, EDTA, and citrates), rare earth and transition metal oxides (e.g., osmium tetraoxide), potassium ferricyanide, potassium dichromate, iodic acid, and the like. A per-compound (as defined by Hawley's Condensed Chemical Dictionary) is a compound containing at least one peroxy group (—O—O—) or a compound containing an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-tert-butyl peroxide, monopersulfates ($SO_5^{2-}$), dipersulfates ($S_2O_8^{2-}$), and sodium peroxide. Examples of compounds containing an element in its highest oxidation state include but are not limited to periodic acid, periodate salts, perbromic acid, perbromate salts, perchloric acid, perchlorate salts, perboric acid, perborate salts, and permanganates. The oxidizing agent preferably is hydrogen peroxide.

Any suitable amount of the oxidizing agent can be present in the polishing composition of the invention. Preferably, the oxidizing agent is present in the polishing composition in an amount of about 0.1–30 wt. %. More preferably, the oxidizing agent is present in the polishing composition in an amount of about 0.3–17 wt. %. Most preferably, the oxidizing agent is present in the polishing composition in an amount of about 0.5–10 wt. %.

The polishing composition can further comprise a chelating or complexing agent. The complexing agent can be any suitable chemical additive that enhances the removal rate of the substrate layer being removed. Suitable chelating or complexing agents can include, for example, carbonyl compounds (e.g., acetylacetonates, and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., dipotassium EDTA), polyacrylates, mixtures thereof, and the like), carboxylates containing one or more sulfonic and/or phosphonic groups, and the like. Suitable chelating or complexing agents also can include, for example, di-, tri-, or polyalcohols (e.g., ethylene glycol, pyrocatechol, pyrogallol, tannic acid, and the like) and amine-containing compounds (e.g., ammonia, amino acids, amino alcohols, di-, tri-, and polyamines, and the like). Preferably, the complexing agent is a carboxylate salt, more preferably an oxalate salt. The choice of chelating or complexing agent will depend on the type of substrate layer being removed. The polishing composition can comprise about 0.1 wt. % to about 20 wt. % (e.g., about 0.5 wt. % to about 20 wt. %, about 0.5 wt. % to about 15 wt. %, or about 1 wt. % to about 10 wt. %) complexing agent, based on the weight of the polishing composition.

The polishing composition of the invention can be prepared by any suitable method. Generally, the polishing composition is prepared by (i) providing a dispersion of metal oxide particles, (ii) adding an appropriate amount of the silane compound to the dispersion, (iii) adding an appropriate amount of the polymer to the dispersion, and (iv) optionally adding suitable amounts of an acid, a surfactant, an oxidizing agent, a chelating or complexing agent, or combinations thereof. The polishing composition can be prepared in a batch or continuous process prior to use, or the polishing composition can be prepared by combining the dispersion of metal oxide particles, the silane compound, and the polymer at the point of use (e.g., on the surface of a substrate to be polished). Alternatively, the polishing composition can be prepared by (i) providing a dispersion of metal oxide particles, (ii) adding an appropriate amount of the silane compound to the dispersion, (iii) drying the resulting mixture to remove any liquid, (iv) re-dispersing the dried mixture obtained in step (iii) in an appropriate amount of the liquid carrier, (v) adding an appropriate amount of the polymer to the dispersion obtained in step (iv), and (vi) optionally adding suitable amounts of an acid, a surfactant, an oxidizing agent, a chelating or complexing agent, or combinations thereof. While not wishing to be bound to any particular theory, it is believed that the aforementioned process promotes the formation of a covalent bond between the metal oxide particle and the silane compound. The polishing composition can also be prepared by (i) attaching the polymer to the silane compound in an appropriate medium, (ii) providing a dispersion of metal oxide particles, (iii) adding the mixture obtained in step (i) to the dispersion of metal oxide particles, (iv) optionally adding an appropriate amount of the liquid carrier, and (v) optionally adding suitable amounts of an acid, a surfactant, an oxidizing agent, a chelating or complexing agent, or combinations thereof.

Typically, the zeta potential of the metal oxide particles will change when the silane compound and/or the polymer is added to the dispersion of metal oxide particles. Preferably, the zeta potential of the metal oxide particles changes by at least about 5 mV, more preferably about 10 mV, when the silane and polymer are added to the dispersion of metal oxide particles.

The invention further provides a method of polishing a substrate with the polishing composition described herein. The method comprises the steps of (i) providing a polishing composition as described herein, (ii) providing a substrate comprising at least one metal layer, and (iii) abrading at least a portion of the metal layer with the polishing composition to polish the substrate.

In particular, the invention provides a method of polishing a substrate, which method comprises the steps of (i) providing a polishing composition comprising (a) an abrasive and (b) a liquid carrier, wherein the abrasive comprises metal oxide particles having a surface with a silane compound adhered to a portion thereof and a polymer adhered to the silane compound and wherein the polymer is selected from the group consisting of water-soluble polymers and water-emulsifiable polymers, (ii) providing a substrate comprising at least one metal layer, and (iii) abrading at least a portion of the metal layer with the polishing composition to polish the substrate.

The polishing composition and method can be used to polish any suitable substrate comprising at least one metal layer. Suitable substrates include, but are not limited to, integrated circuits, memory or rigid disks, metals, interlayer dielectric (ILD) devices, semiconductors, micro-electro-mechanical systems, ferroelectrics, and magnetic heads. The metal layer can comprise any suitable metal. For example, the metal layer can comprise copper, tantalum, titanium, aluminum, nickel, platinum, ruthenium, iridium, or rhodium. The substrate can further comprise at least one insulating layer. The insulating layer can be a metal oxide, porous metal oxide, glass, organic polymer, fluorinated organic polymer, or any other suitable high or low-K insulating layer.

The polishing method of the invention is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention and then the polishing pad moving relative to the substrate, so as to abrade at least a portion of the substrate to polish the substrate.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a workpiece being polished enables the determination of the polishing end-point, i.e., the determination of when to terminate the polishing process with respect to a particular workpiece.

The CMP apparatus can further comprise a means for oxidizing the substrate. In electrochemical polishing systems, the means for oxidizing the substrate preferably comprises a device for applying a time-varying potential (e.g., anodic potential) to the substrate (e.g., electronic potentiostat). The device for applying time-varying potential to the substrate can be any suitable such device. The means for oxidizing the substrate preferably comprises a device for applying a first potential (e.g., a more oxidizing potential) during an initial stage of the polishing and applying a second potential (e.g., a less oxidizing potential) at or during a later stage of polishing, or a device for changing the first potential to the second potential during an intermediate stage of polishing, e.g., continuously reducing the potential during the intermediate stage or rapidly reducing the potential from a first, higher oxidizing potential to a second, lower oxidizing potential after a predetermined interval at the first, higher oxidizing potential. For example, during the initial stage(s) of the polishing, a relatively high oxidizing potential is applied to the substrate to promote a relatively high rate of oxidation/dissolution/removal of the substrate. When polishing is at a later stage, e.g., when approaching an underlying barrier layer, the applied potential is reduced to a level producing a substantially lower or negligible rate of oxidation/dissolution/removal of the substrate, thereby eliminating or substantially reducing dishing, corrosion, and erosion. The time-varying electrochemical potential is preferably applied using a controllably variable DC power supply, e.g., an electronic potentiostat. U.S. Pat. No. 6,379,223 further describes a means for oxidizing a substrate by applying a potential.

The following examples further illustrate the invention but, of course, should not be construed as in any way limiting its scope.

EXAMPLE 1

This example demonstrates the preparation of abrasive particles according to the invention. A dispersion of colloidal silica (7% solid content) having a mean particle size of 145 nm and zeta potential of −36 mV (measured at pH 4) was mixed with γ-aminopropyltriethoxysilane in a 100:2.5 ratio (wt/wt, on active basis) in deionized water. After the pH of the dispersion was adjusted to about 4, the resulting particles (in dispersion) had a mean particle size of 148 nm, and zeta potential of +51 mV (measured at pH 4). The dispersion was then blended in a conventional shear mixing apparatus with poly(acrylamidomethylpropanesulfonic acid) in a ratio of one part polymer per ten parts silica.

The resulting abrasive dispersion contained metal oxide particles having a silane compound adhered to a portion of the surface of the metal oxide particles and a polymer adhered to the silane compound. The abrasive particles had a mean particle size of 159 nm and zeta potential of −56 mV (measured at pH 4). Furthermore, after storing the dispersion of the abrasive particles for three months, the particle size and zeta potential showed no observable change in values.

EXAMPLE 2

This example demonstrates the preparation of abrasive particles according to the invention. A dispersion of fumed silica (5% solid content) having a mean particle size of 140 nm and zeta potential of −11 mV (measured at pH 4) was mixed with γ-aminopropyltriethoxysilane in de-ionized water, and the pH of the dispersion was adjusted to about 4. The size of the metal oxide particles was 137 nm, and the zeta potential was +35 mV. The dispersion was then blended with poly(acrylamidomethylpropanesulfonic acid) in a ratio of one part polymer per ten parts silica.

The resulting abrasive particles had a mean particle size of 141 nm and a zeta potential of −47 mV. The particle size and zeta potential of the abrasive particles showed no observable change in values after the dispersion was stored for three months.

EXAMPLE 3

This example demonstrates the preparation of abrasive particles according to the invention. A dispersion of colloidal silica (10% solid content) having a mean particle size of 72 nm and zeta potential of −34 mV was mixed with γ-aminopropyltriethoxysilane in de-ionized water, and the pH was adjusted to about 4. After mixing, the metal oxide particles had a mean particle size of 97 nm and a zeta potential of +44 mV. The dispersion was then blended with poly(acrylamidomethylpropanesulfonic acid) in a ratio of 0.1 parts polymer per one part of particles.

The resulting abrasive particles had a mean particle size of 91 nm and a zeta potential of −48 mV. The zeta potential and particle size of the abrasive particles showed no observable change after three months of storage.

EXAMPLE 4

This example demonstrates the preparation of abrasive particles according to the invention. A dispersion of colloidal silica (7% solid content) having a mean particle size of 145 nm and zeta potential of −36 mV was mixed with γ-aminopropyltriethoxysilane in de-ionized water. The dispersion was then blended with an acrylamidomethylpropanesulfonic acid and acrylic acid copolymer in a ratio of one part copolymer per ten parts silica. The resulting abrasive particles had a mean particle size of 154 nm and a zeta potential of −56 mV.

EXAMPLE 5

This example demonstrates the preparation of abrasive particles according to the invention. A dispersion of colloidal silica (7% solid content) having a mean particle size of 145 nm and zeta potential of −36 mV was mixed with N-beta-(aminoethyl)-γ-aminopropylmethyldimethoxysilane in de-ionized water. The dispersion was then blended with poly(acrylamidomethylpropanesulfonic acid) in a ratio of one part polymer per ten parts silica. The resulting abrasive particles had a mean particle size of 153 nm and a zeta potential of −57 mV.

EXAMPLE 6

This example demonstrates the preparation of abrasive particles according to the invention. A dispersion of colloidal silica (7% solid content) having a mean particle size of 145 nm and zeta potential of −36 mV was mixed with diethylene triaminopropyltrimethoxysilane in de-ionized water. The dispersion was then blended with poly (acrylamidomethylpropanesulfonic acid) in a ratio of one part polymer per ten parts silica. The resulting abrasive particles had a mean particle size of 175 nm and a zeta potential of −54 mV.

COMPARISON EXAMPLE 1

A dispersion of colloidal silica (7% solid content) having mean particle size of 145 nm and zeta potential of −36 mV (measured at pH 4) was mixed with γ-aminopropyltriethoxysilane in a 100:2.5 ratio (wt/wt, on active basis) in de-ionized water. After the pH was adjusted to about 4, the silica particles had a mean particle size of 148 nm and zeta potential of +51 mV.

COMPARISON EXAMPLE 2

A dispersion of colloidal silica (7% solid content) having mean particle size of 145 nm and zeta potential of −36 mV was blended with poly(acrylamidomethylpropanesulfonic acid) in a conventional shear mixing apparatus in a 10:1 ratio (wt/wt, on active basis) in de-ionized water. After the pH was adjusted to about 4, the silica particles had a mean particle size of 153 nm and zeta potential of −42 mV.

EXAMPLE 7

This example demonstrates the colloidal stability of a dispersion containing the abrasive particles of the invention. Two hundred eighty-five parts of the abrasive particles of Example 1 were mixed with forty parts of polyacrylic acid (25% active) and seven parts of maleic acid in de-ionized water. The pH of the mixture was adjusted to about 4 and placed in a 100 ml cylinder. After the mixture was allowed to sit undisturbed for 5 hours, no separation (at top) or precipitation of the abrasive particles (at bottom) was observed. Particle size analysis of the mixture indicated that the mean particle size of the abrasive particles was 266 nm.

EXAMPLE 8

This example demonstrates the colloidal stability of a dispersion containing the abrasive particles of the invention. Four hundred parts of the abrasive particles of Example 2 were mixed with forty parts of polyacrylic acid (25% active) and seven parts of maleic acid in de-ionized water. The pH of the mixture was adjusted to about 4 and placed in a 100 ml cylinder. After the mixture was allowed to sit undisturbed for 24 hours, no separation (at top) or precipitation of the abrasive particles (at bottom) was observed. Particle size analysis of the mixture indicated that the mean particle size of the abrasive particles was 273 nm.

EXAMPLE 9

This example demonstrates the colloidal stability of a dispersion containing the abrasive particles of the invention. Two hundred eighty-five parts of the abrasive particles of Example 5 were mixed with forty parts of polyacrylic acid (25% active) and seven parts of maleic acid in de-ionized water. The pH of the mixture was adjusted to about 4 and placed in a 100 ml cylinder. After the mixture was allowed to sit undisturbed for 24 hours, no separation (at top) or precipitation of the abrasive particles (at bottom) was observed. Particle size analysis of the mixture indicated that the mean particle size of the abrasive particles was 171 nm.

COMPARATIVE EXAMPLE 3

One hundred parts of an untreated dispersion of colloidal silica particles (20% solid content) having a mean particle size of 145 nm and zeta potential of −36 mV were mixed with forty parts of polyacrylic acid (25% active) and seven parts of maleic acid in de-ionized water. The pH of the mixture was adjusted to about 4 and placed in a 100 ml cylinder. After the mixture was allowed to sit undisturbed for 5 hours, the mixture had separated into two layers, with a top clear layer (76 ml) and a bottom slurry layer (24 ml), indicating approximately 76% settling. Particle size analysis of the mixture indicated that the mean particle size of the abrasive particles was 7690 nm.

COMPARATIVE EXAMPLE 4

Two hundred eighty-five parts of the metal oxide particles of Comparative Example 1 were mixed with forty parts of polyacrylic acid (25% active) and seven parts of maleic acid in de-ionized water. The pH of the mixture was adjusted to about 4, and the mixture was placed in a 100 ml cylinder. After the mixture was allowed to sit undisturbed for 5 hours, the mixture had separated into two layers, with a top clear layer (78 ml) and a bottom slurry layer (22 ml), indicating approximately 78% settling. Particle size analysis of the mixture indicated that the mean particle size of the metal oxide particles was 7690 nm.

COMPARATIVE EXAMPLE 5

Two hundred eighty-five parts of the metal oxide particles of Comparative Example 2 were mixed with forty parts of polyacrylic acid (25% active) and seven parts of maleic acid in de-ionized water. The pH of the mixture was adjusted to about 4, and the mixture was placed in a 100 ml cylinder. After the mixture was allowed to sit undisturbed for 5 hours, a layer of particles measuring 1 mm in thickness had formed at the bottom of the cylinder. Particle size analysis indicated that the mean particle size of the metal oxide particles was 293 nm.

EXAMPLE 10

This example demonstrates the effectiveness of the polishing composition of the invention. Similar patterned substrates comprising copper, tantalum, and silicon oxide layers (Semitech 931) were polished with four different chemical-mechanical polishing compositions (Polishing Compositions 10A, 10B, 10C, and 10D). Polishing Composition 10A (invention) comprised 2 wt. % of the abrasive particles of Example 1. Polishing Composition 10B (invention) comprised 2 wt. % of the abrasive particles of Example 3. Polishing Composition 10C (comparison) comprised 2 wt. % of an untreated colloidal silica having a mean particle size of 145 nm and a zeta potential (at pH of 4) of −36 mV. Polishing Composition 10D (comparison) comprised 2 wt. % of an untreated colloidal silica having a mean particle size of 72 nm and a zeta potential (at pH of 4) of −34 mV. Each of the aforementioned polishing compositions also comprised an oxidizing agent, a copper complexing agent, and a copper inhibitor.

The values for copper dishing (in angstroms) were measured at different regions of the patterned substrate including at the 100 μm line and the 90% line density region (4.5 μm Cu lines separated by 0.5 μm space) for each of the chemical-mechanical polishing compositions. The values for clear time (i.e., total polishing time required to remove the entire copper layer) also were measured for each of the chemical-mechanical polishing compositions. The results are summarized in Table 1.

TABLE 1

Clear times and copper dishing values.

| Polishing Composition | Total Polishing Time/Clear Time (s) | Copper Dishing 100 μm line (Å) | Copper Dishing 4.5 μm (90%) (Å) |
|---|---|---|---|
| 10A | 140 | 1276 | 1087 |
| 10B | 220 | 843 | 867 |
| 10C | 375 | — | — |
| 10D | 375 | 1579 | 1775 |

These results demonstrate that the polishing composition of the invention provides relatively high polishing rates with relatively low dishing as compared to a similar polishing composition comprising untreated metal oxide particles. In particular, the clear time, which is inversely related to the polishing rate, for each of Polishing Compositions 10A and 10B was less than 60% of the clear time for Polishing Compositions 10C and 10D. Moreover, the copper dishing values for Polishing Compositions 10A and 10B were significantly lower that the values for Polishing Composition 10D. The copper dishing values for Polishing Composition 10C could not be determined due to the presence of a significant amount of copper residue on the surface of the substrate.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of polishing a substrate, which method comprises the steps of:
    (i) providing a polishing composition comprising:
        (a) an abrasive and
        (b) a liquid carrier,
    wherein the abrasive comprises metal oxide particles having a surface with a silane compound adhered to a portion thereof and a polymer adhered to the silane compound and wherein the polymer is selected from the group consisting of water-soluble polymers and water-emulsifiable polymers,
    (ii) providing a substrate comprising at least one metal layer, and
    (iii) abrading at least a portion of the metal layer with the polishing composition to polish the substrate.

2. The method of claim 1, wherein the silane compound is selected from the group consisting of functionalized silanes, disilanes, trisilanes, oligomeric silanes, polymeric silanes, and combinations thereof.

3. The method of claim 2, wherein the silane compound comprises at least one functional group selected from the group consisting of amine groups, carboxylic acid groups, anhydride groups, phosphonic acid groups, pyridinyl groups, hydroxyl groups, epoxy groups, and salts thereof.

4. The method of claim 3, wherein the silane compound comprises at least one amine group.

5. The method of claim 1, wherein the polymer is an anionic polymer or copolymer.

6. The method of claim 5, wherein the anionic polymer or copolymer comprises repeating units containing carboxylic acid, sulfonic acid, or phosphonic acid functional groups, or combinations thereof.

7. The method of claim 6, wherein the silane compound comprises at least one amine group.

8. The method of claim 6, wherein the anionic polymer or copolymer comprises repeating units selected from the group consisting of acrylic acid, methacrylic acid, itaconic acid, maleic acid, maleic anhydride, vinyl sulfonic acid, 2-methacryloyloxyethanesulfonate, styrenesulfonic acid, 2-acrylamido-2-methylpropane sulfonic acid (AMPS), vinylphosphonic acid, 2-(methacryloyloxy)ethylphosphate, salts thereof, and combinations thereof.

9. The method of claim 1, wherein the polymer is a cationic polymer or copolymer.

10. The method of claim 9, wherein the cationic polymer or copolymer comprises repeating units containing amine functional groups.

11. The method of claim 10, wherein the cationic polymer or copolymer comprises repeating units selected from the group consisting of allylamine, vinylamine, ethyleneimine, vinyl pyridine, diethylaminoethyl methacrylate, diallyldimethylammonium chloride, methacryloyloxyethyltrimethylammonium sulfate, and combinations thereof.

12. The method of claim 1, wherein the silane compound comprises at least one functional group selected from the group consisting of hydroxyl groups, epoxy groups, and salts thereof, and the polymer comprises at least one functional group selected from the group consisting of amine groups, carboxylic acid groups, and salts thereof.

13. The method of claim 1, wherein the metal oxide particles comprise a metal oxide selected from the group consisting of alumina, silica, titania, ceria, zirconia, germania, magnesia, tantalum oxide ($TaO_x$), and combinations thereof.

14. The method of claim 13, wherein the metal oxide particles comprise silica.

15. The method of claim 1, wherein the polishing composition further comprises an acid.

16. The method of claim 15, wherein the acid is an inorganic acid.

17. The method of claim 16, wherein the acid is an inorganic acid selected from the group consisting of nitric acid, phosphoric acid, sulfuric acid, salts thereof, and combinations thereof.

18. The method of claim 15, wherein the acid is an organic acid.

19. The method of claim 18, wherein the acid is an organic acid selected from the group consisting of oxalic acid, malonic acid, tartaric acid, acetic acid, lactic acid, propionic acid, phthalic acid, benzoic acid, citric acid, succinic acid, salts thereof, and combinations thereof.

20. The method of claim 1, wherein the polishing composition has a pH of about 3 to about 7.

21. The method of claim 1, wherein the polishing composition further comprises a surfactant.

22. The method of claim 1, wherein the polishing composition further comprises a chemical oxidizing agent.

23. A polishing composition comprising:
   (i) an abrasive and
   (ii) a liquid medium,
wherein the abrasive comprises metal oxide particles having a surface with a silane compound adhered to a portion thereof and a polymer adhered to the silane compound, the polymer is selected from the group consisting of water-soluble polymers and water-emulsifiable polymers, the total amount of metal oxide particles present in the polishing composition is no greater than about 20% by weight of the polishing composition, and the metal oxide particles do not comprise zirconia.

24. The polishing composition of claim 23, wherein the silane compound is selected from the group consisting of functionalized silanes, disilanes, trisilanes, oligomeric silanes, polymeric silanes, and combinations thereof.

25. The polishing composition of claim 24, wherein the silane compound comprises at least one functional group selected from the group consisting of amine groups, carboxylic acid groups, anhydride groups, phosphonic acid groups, pyridinyl groups, hydroxyl groups, epoxy groups, and salts thereof.

26. The polishing composition of claim 25, wherein the silane compound comprises at least one amine group.

27. The polishing composition of claim 23, wherein the polymer is an anionic polymer or copolymer.

28. The polishing composition of claim 27, wherein the anionic polymer or copolymer comprises repeating units containing carboxylic acid, sulfonic acid, or phosphonic acid functional groups, or combinations thereof.

29. The polishing composition of claim 28, wherein the silane compound comprises at least one amine group.

30. The polishing composition of claim 28, wherein the anionic polymer or copolymer comprises repeating units selected from the group consisting of acrylic acid, methacrylic acid, itaconic acid, maleic acid, maleic anhydride, vinyl sulfonic acid, 2-methacryloyloxyethanesulfonate, styrenesulfonic acid, 2-acrylamido-2-methylpropane sulfonic acid (AMPS), vinylphosphonic acid, 2-(methacryloyloxy) ethylphosphate, salts thereof, and combinations thereof.

31. The polishing composition of claim 23, wherein the polymer comprises a cationic polymer or copolymer.

32. The polishing composition of claim 31, wherein the cationic polymer or copolymer comprises repeating units containing amine functional groups.

33. The polishing composition of claim 32, wherein the cationic polymer or copolymer comprises repeating units selected from the group consisting of allylamine, vinylamine, ethyleneimine, vinyl pyridine, diethylaminoethyl methacrylate, diallyldimethylammonium chloride, methacryloyloxyethyltrimethylammonium sulfate, and combinations thereof.

34. The polishing composition of claim 23, wherein the silane compound comprises at least one functional group selected from the group consisting of hydroxyl groups, epoxy groups, and salts thereof, and the polymer comprises at least one functional group selected from the group consisting of amine groups, carboxylic acid groups, and salts thereof.

35. The polishing composition of claim 23, wherein the abrasive is selected from the group consisting of alumina, silica, titania, ceria, germania, magnesia, tantalum oxide ($TaO_x$), and combinations thereof.

36. The polishing composition of claim 35, wherein the abrasive is silica.

37. The polishing composition of claim 23, wherein the polishing composition further comprises an acid.

38. The polishing composition of claim 37, wherein the acid is an inorganic acid.

39. The polishing composition of claim 38, wherein the inorganic acid is selected from the group consisting of nitric acid, phosphoric acid, sulfuric acid, salts thereof, and combinations thereof.

40. The polishing composition of claim 37, wherein the acid is an organic acid.

41. The polishing composition of claim 40, wherein the organic acid is selected from the group consisting of oxalic acid, malonic acid, tartaric acid, acetic acid, lactic acid, propionic acid, phthalic acid, benzoic acid, citric acid, succinic acid, salts thereof, and combinations thereof.

42. The polishing composition of claim 23, wherein the polishing composition has a pH of about 3 to about 7.

43. The polishing composition of claim 23, wherein the polishing composition further comprises a surfactant.

44. The polishing composition of claim 23, wherein the polishing composition further comprises a chemical oxidizing agent.

\* \* \* \* \*